United States Patent
Son et al.

(10) Patent No.: US 9,482,916 B2
(45) Date of Patent: Nov. 1, 2016

(54) LIQUID CRYSTAL DISPLAY

(71) Applicant: LG Display Co., Ltd., Seoul (KR)

(72) Inventors: SungSik Son, Gyeongsangbuk-do (KR); JongSeok Cha, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/568,378

(22) Filed: Dec. 12, 2014

(65) Prior Publication Data

US 2016/0004116 A1    Jan. 7, 2016

(30) Foreign Application Priority Data

Jul. 3, 2014 (KR) ........................ 10-2014-0083288

(51) Int. Cl.
| | |
|---|---|
| *G02F 1/1345* | (2006.01) |
| *F21V 8/00* | (2006.01) |
| *H05K 1/02* | (2006.01) |
| *G02F 1/1333* | (2006.01) |

(52) U.S. Cl.
CPC ......... *G02F 1/13452* (2013.01); *G02B 6/0083* (2013.01); *G02B 6/0088* (2013.01); *G02F 1/133308* (2013.01); *H05K 1/028* (2013.01); *G02F 2001/133317* (2013.01); *G02F 2201/42* (2013.01); *H05K 2201/10136* (2013.01)

(58) Field of Classification Search
CPC ................... G02F 1/13452; G02F 1/133308; G02F 2201/42; G02F 2001/133317; G02B 6/0088; G02B 6/0083; H05K 1/028; H05K 2201/10136
See application file for complete search history.

(56) References Cited

U.S. PATENT DOCUMENTS

| | | | |
|---|---|---|---|
| 2012/0182515 A1 | 7/2012 | Pyo | |
| 2013/0088671 A1 | 4/2013 | Drzaic et al. | |
| 2015/0219955 A1* | 8/2015 | Son ................... | G02F 1/133308 349/58 |

FOREIGN PATENT DOCUMENTS

EP        2192438 A2       6/2010

OTHER PUBLICATIONS

Communication dated Oct. 5, 2015 from the European Patent Office in counterpart European application No. 14196509.5-1904.

* cited by examiner

*Primary Examiner* — Anne Hines
*Assistant Examiner* — Jose M Diaz
(74) *Attorney, Agent, or Firm* — Morgan, Lewis & Bockius LLP

(57) ABSTRACT

A liquid crystal display (LCD) includes a liquid crystal module defining an opening, the liquid crystal module including a printed circuit board having a pad portion exposed to the opening; a set printed circuit board disposed adjacent a surface of the liquid crystal module; and a connector disposed between the liquid crystal module and the set printed circuit board through the opening to electrically connect the liquid crystal module and the pad portion.

20 Claims, 14 Drawing Sheets

LIQUID CRYSTAL DISPLAY

This application claims the benefit of earlier filing date and right of priority to Korean Patent Application No. 10-2014-0083288, filed on Jul. 3, 2014, which is hereby incorporated by reference herein in its entirety.

BACKGROUND OF THE INVENTION

1. Field of the Invention

The present disclosure relates to a liquid crystal display (LCD) and, more particularly, to an LCD in which assembly of a liquid crystal display module (LCM) and a set printed circuit board (PCB) is simplified by using a separate connector.

2. Discussion of the Related Art

Recently, liquid crystal displays (LCDs) or light emitting displays, for example, have been used as flat panel displays in personal computers, portable terminals, monitors of various information devices, and the like. Among them, an LCD displays an image by adjusting light transmittance of liquid crystal using an electric field. To this end, an LCD includes a liquid crystal module formed by assembling a liquid crystal panel in which pixel regions are arranged, a driving circuit for driving the liquid crystal panel, and a backlight unit for irradiating light into the liquid crystal panel.

An assembly structure of an existing LCD employing a liquid crystal module will be described with reference to FIGS. 1 through 3D. FIG. 1 is a plan view illustrating the rear of an LCD formed by assembling a middle frame and a set printed circuit board (PCB) to a liquid crystal module (LCM). FIG. 2 is a cross-sectional view taken along line II-II of FIG. 1, illustrating a coupled state of the OCM, the middle frame, and the set PCB according to a related art.

As illustrated in FIGS. 1 and 2, the related art LCD 1 includes a liquid crystal module (LCM) 10, a middle frame 20 coupled to the rear of the LCM 10, and a set printed circuit board (PCB) 30 coupled to the rear of the middle frame 20. The LCM 10 includes a liquid crystal panel (not shown) and a backlight unit (not shown), and a flexible PCB (FPCB) 15 (shown in FIG. 2) for transmitting a current and various signals is provided in a lower end of the LCM 10 in order to control driving of the LCM 10.

As illustrated in FIG. 2, the FPCB 15 provided in the lower end of the LCM 10 is bent to penetrate through a circuit board insertion hole 23 formed on one side of the middle frame 20 coupled to the rear of the LCM 10, so as to protrude outwardly and be fastened to a PCB connector portion 35 of the set PCB 30 coupled to the rear of the middle frame 20 and having various electric elements (not shown) mounted thereon.

An assembly method of the existing LCD configured as a combination of the LCM 10, the middle frame 20, and the set PCB 30 will be described with reference to FIGS. 3A through 3D. FIGS. 3A through 3D are plan views illustrating an assembly process of components constituting the related art LCD.

With reference to FIG. 3A, the LCM 10 includes a liquid crystal panel (not shown) and a backlight unit (not shown) is prepared. In this case, the liquid crystal panel (not shown) is assembled in a state in which a liquid crystal material is injected between upper and lower conductive glass panels, and the FPCB 15 for delivering a current and various signals is provided to control driving of the LCM 10.

Next, with reference to FIG. 3B, the middle frame 20 to be coupled to the rear of the LCM 10 is prepared. Circuit board insertion holes 23 are disposed to allow the FPCB 15 of the LCM 10 to penetrate therethrough so as to be exposed outwardly, and a battery receiving portion 25 is provided in a central portion to allow a battery (not shown) to be disposed in the LCD 1.

Subsequently, with reference to FIG. 3C, with the middle frame 20 coupled to the rear of the LCM 10, a pad portion 15a of the FPCB 15 provided in the LCM 10 penetrates through the circuit board insertion holes 23 provided in the middle frame 20 and protrudes from the rear of the middle frame 20.

Thereafter, as shown in FIG. 3D, the set PCB 30 having various electric elements (not shown) disposed thereon is coupled to the rear of the middle frame 20, for example, to a portion excluding the battery receiving portion 25. Here, the pad portion 15a of the FPCB 15 is protruded from the side of the set PCB 30 and inserted into the PCB connector portion 35 provided on one side of the rear of the set PCB 30 in a bent state.

Subsequently, although not shown, a battery is disposed in the battery receiving portion 25 of the set PCB 30, and other components are appropriately disposed in the other portions to complete the assembly process of the LCD 1 according to the related art.

According to the related art LCD, after the FPCB of the LCM is bent and attached to the rear of the middle frame, the pad portion of the FCPB of the LCM is fastened to the PCB connector portion of the set PCB coupled to the rear of the middle frame so as to be assembled. However, in assembling the LCM and the middle frame, it is difficult to bend the FPCB and insert the FPCB to the circuit board insertion holes of the middle frame, considerably lengthening an assembly process time. Also, when the connector of the FPCB and the connector of the set PCB are connected, the pad portion of the FPCB of the LCM is further bent and fastened to the PCB connector portion of the set PCB, thereby increasing the thickness of the device increases as well as resulting in a great number of assembly defects.

In particular, when the FPCB of the existing LCM is a bent type, the FPCB of the LCM needs to be bent in consideration of the width of a set bezel, and since a structure of the middle frame is limited to correspond to various FPCB structures, assembly characteristics and productivity are degraded in assembling an LCD. In addition, when the LCM and the set PCB are coupled, the bent pad portion of the FPCB and the PCB connector portion of the set PCB need to be fastened, a complicated structure is required to fasten the connectors according to the internal structure of the set PCB.

Meanwhile, the assembly structure of the existing device, for example, the assembly structure among the LCM, the middle frame, and the set PCB, significantly degrades productivity in terms of bending and fastening of the FPCB and has a limitation in reducing a thickness of a product.

SUMMARY OF THE INVENTION

Accordingly, the present invention is directed to a liquid crystal display (LCD) that substantially obviates one or more of the problems due to limitations and disadvantages of the related art.

An object of the present invention is to provide a liquid crystal display (LCD) device to simplify assembly of a liquid crystal module (LCM) and a set PCB compact using a connector.

Another object of the present invention is to provide a liquid crystal display implementing a slim structure of a product due to assembly of the LCM and the set PCB.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantage and in accordance with the purpose of the present invention, a liquid crystal display includes a liquid crystal module defining an opening, the liquid crystal module including a printed circuit board having a pad portion exposed to the opening; a set printed circuit board disposed adjacent a surface of the liquid crystal module; and a connector disposed between the liquid crystal module and the set printed circuit board through the opening to electrically connect the liquid crystal module and the pad portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "connected with" another element, it can be directly connected with the other element or intervening elements may also be present. In contrast, when an element is referred to as being "directly connected with" another element, there are no intervening elements present.

The terminology used herein is for the purpose of describing particular embodiments only and is not intended to be limiting of the invention, and as used herein, the singular forms "a," "an," and "the" are intended to include the plural forms as well, unless the context clearly indicates otherwise.

A liquid crystal display (LCD) device according to an embodiment of the present disclosure will be described, but it should be appreciated that the present disclosure may also be applied to flat panel displays including a light emitting display, in addition to the LCD device.

Hereinafter, the LCD device according to embodiments of the present invention will be described in detail with reference to the accompanying drawings. However, the disclosure is not limited to the embodiments described hereinafter and may be embodied in any other forms.

Figure 1:
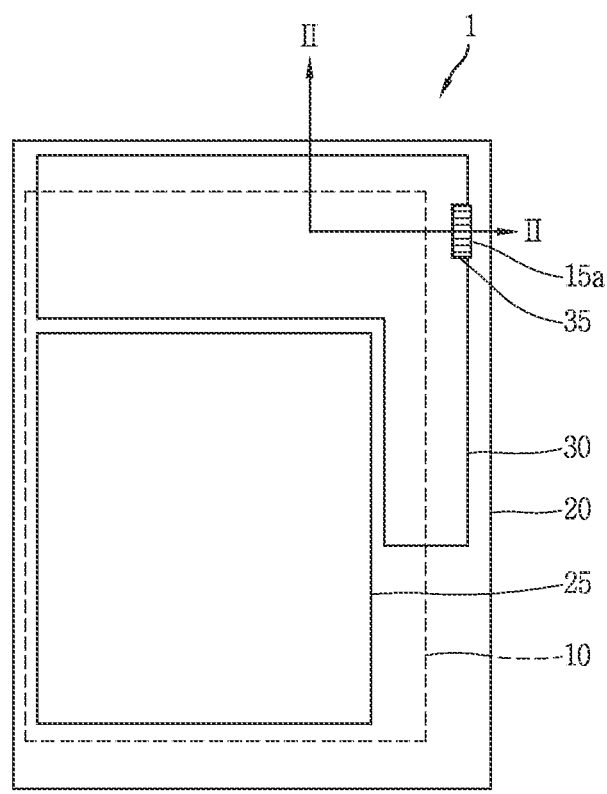
FIG. 1 is a plan view illustrating the rear of a liquid crystal display (LCD) formed by assembling a middle frame and a set PCB to a liquid crystal module (LCM) according to the related art.
Figure 2:
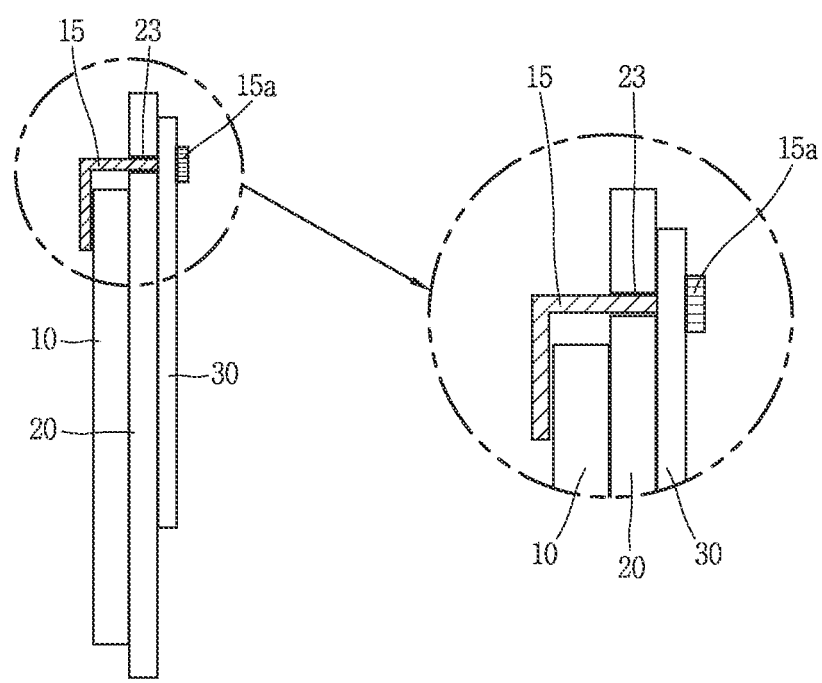
FIG. 2 is a cross-sectional view taken along line II-II of FIG. 1, illustrating a coupled state of the LCM, the middle frame, and the set PCB according to the related art.
Figure 3A:
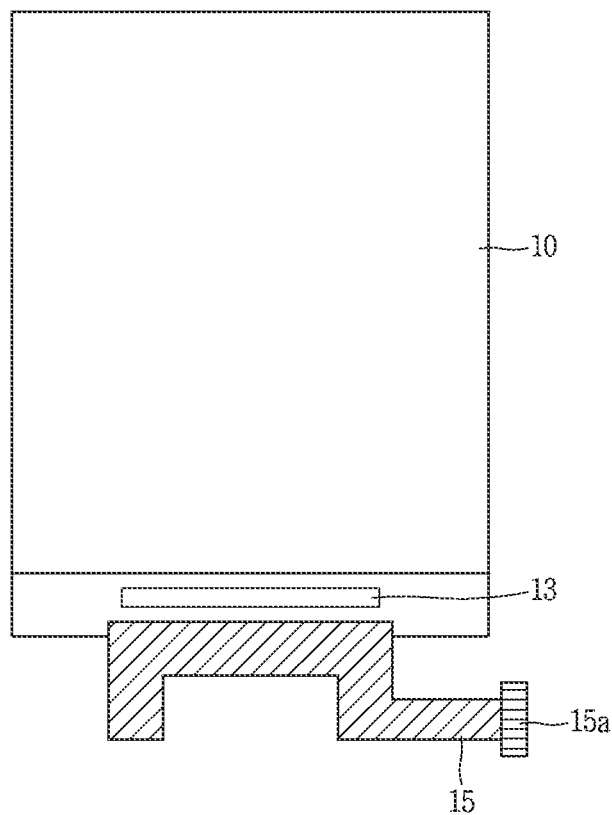
FIGS. 3A through 3D are plan views illustrating an assembly process of components of the related art LCD.
Figure 3B:
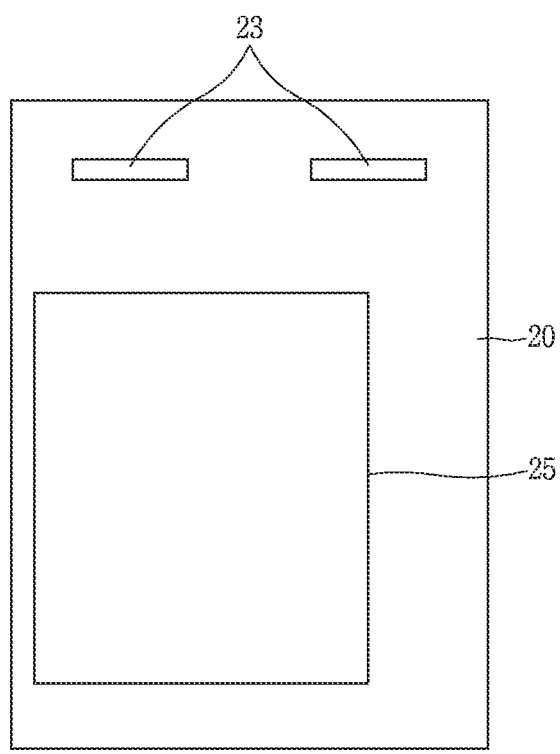
Figure 3C:
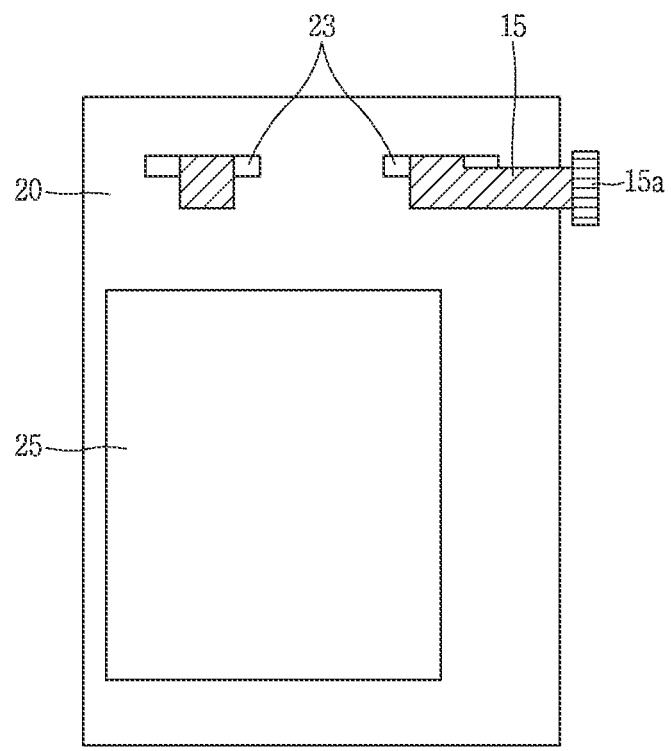
Figure 3D:
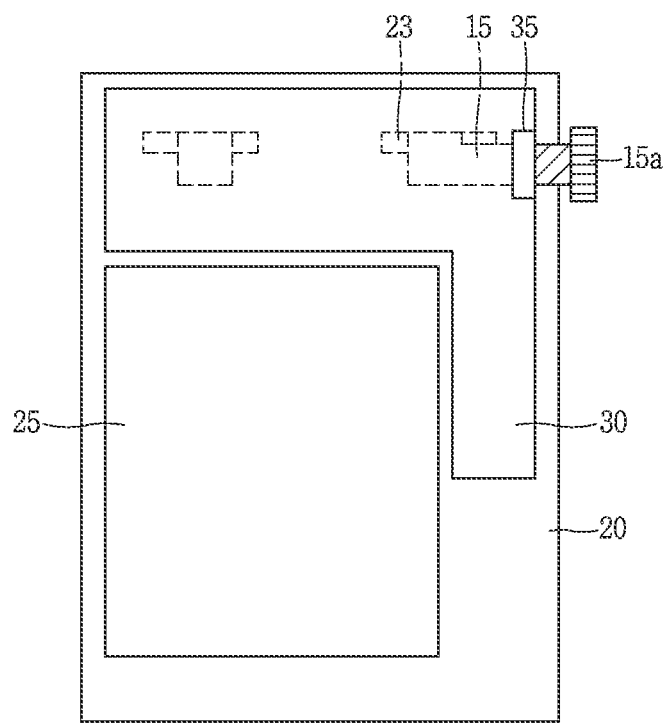
Figure 4:
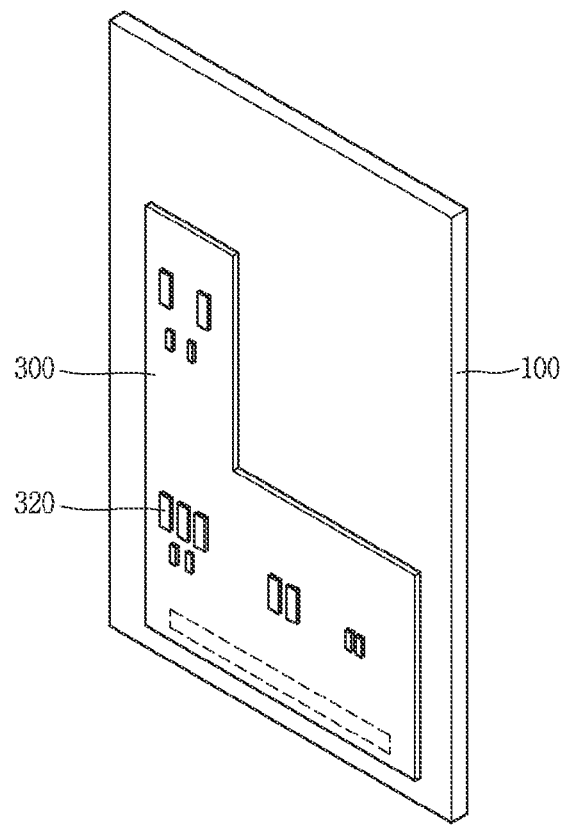
FIG. 4 is a perspective view of an LCD device according to an example embodiment of the present invention illustrating the rear of the LCD device in a state in which a liquid crystal module (LCM) and a set PCB are assembled.
Figure 5:
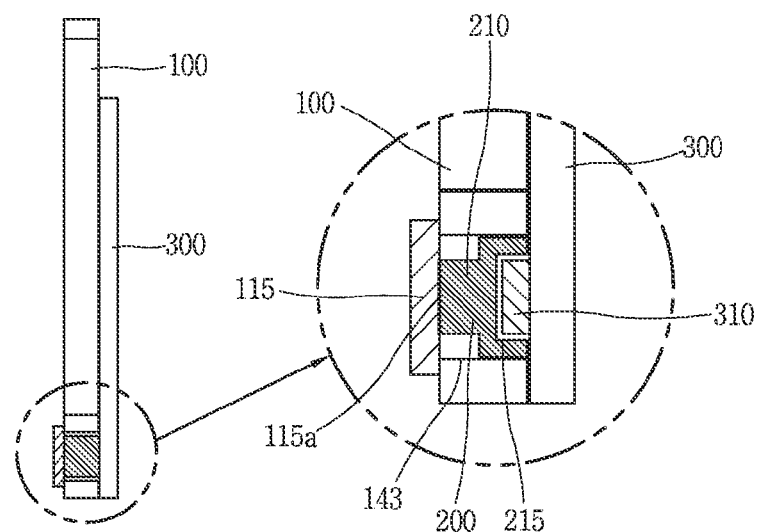
FIG. 5 is a cross-sectional view of the LCD device according to an example embodiment of the present invention illustrating a state in which a connector is fastened between the LCM and the set PCB.

FIG. 4 is a perspective view of an LCD device according to an example embodiment of the present invention illustrating the rear of the LCD device in a state in which a liquid crystal module (LCM) and a set PCB are assembled. FIG. 5 is a cross-sectional view of the LCD device according to an example embodiment of the present invention illustrating a state in which a connector is fastened between the LCM and the set PCB.

As shown in FIG. 4, the LCD device according to an example embodiment of the present invention includes a liquid crystal module (LCM) 100 including a liquid crystal panel (not shown) displaying an image, a backlight unit (not shown) irradiating a light beam to the liquid crystal panel (not shown), and components covering them and a set printed circuit board (PCB) 300 assembled to the rear of the LCM 100 and having various electric elements 320.

With reference to FIG. 5, a first terminal 210 of a connector 200 is fastened to a pad portion 115a of a flat-type FPCB disposed in a lower portion of the LCM 100, and a PCB connector portion 310 of the set PCB 300 is fastened to a second terminal 215 of the connector 200.

In this manner, rather than adopting the assembly method in which a flat-type FPCB of an LCM is bent and attached to the rear of a frame through circuit insertion holes formed in a middle frame, and thereafter, a pad portion of the FPCB is fastened to an PCB connector portion of a set PCB coupled thereafter, such as that of the related art, in the LCD device according to an example embodiment of the present invention, the pad portion of the FPCB and the PCB connector portion of the set PCB are fastened using the separate connector, whereby a defect and a degradation of quality due to bending of the FPCB when a product is assembled can be prevented.

Also, in the LCD device according to an example embodiment of the present invention, since the FPCB of the LCM and the set PCB are directly fastened using the separate connector, a thickness of the LCD device can be reduced and a slim depth can be implemented, as compared to the case of bending the FPCB as in the related art.

In addition, in the LCD device according to an example embodiment of the present invention, because the FPCB of the LCM and the set PCB are directly fastened and assembled using the separate connector, a middle frame can be omitted, implementing a slim depth.

Figure 6:
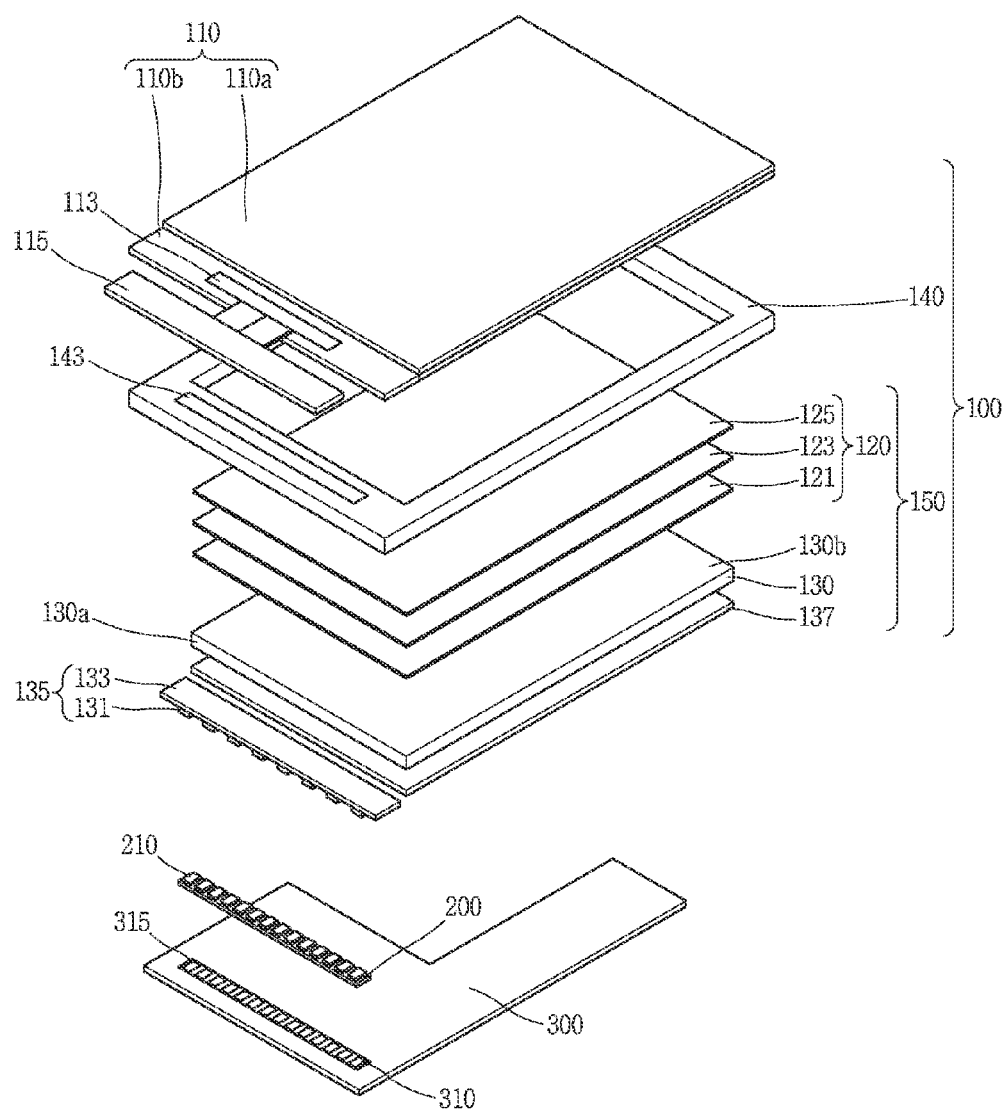
FIG. 6 is an exploded perspective view of the LCD device according to an example embodiment of the present invention.

FIG. 6 is a exploded perspective view of the LCD device according to an example embodiment of the present invention.

With reference to FIG. 6, the LCD device according to an example embodiment of the present invention includes the LCM 100, the set PCB 300, the connector 200 interposed between the LCM 100 and the set PCB 300 to electrically connect them, and components (not shown) covering the LCM 100 and the set PCB 300. The LCM 100 includes a liquid crystal panel 110 displaying an image, a backlight unit 150 providing a light beam to the liquid crystal panel 110, and a guide panel 140 covering the liquid crystal panel 110 and the backlight unit 150. The liquid crystal panel 110 includes a TFT array substrate 110b including switching elements (namely, a thin film transistor array) for switching signals supplied to liquid crystal cells arranged in a matrix form and a color filter substrate 110a applying a color to light that passes through the liquid crystal cells.

A driver 113 and the flat-type FPCB 115 are coupled to one side of the liquid crystal panel 110. The driver 113 drives unit pixels formed in the liquid crystal panel 110. One end of the FPCB 115 is coupled to the liquid crystal panel 110 to deliver control signals and data signals of switching elements through the driver 113. Here, the liquid crystal panel 110 forms an image as liquid crystal cells adjust light transmittance according to pixel signal information delivered from the driver 113. Although not shown, a plurality of gate lines and a plurality of data lines are formed in a matrix form in the TFT array substrate 110b, and TFTs (not shown) are formed at intersections of the gate lines and the data lines.

A signal voltage delivered from the driver 113 is applied between a pixel electrode and a common electrode (not shown) of the color filter array substrate 110a (to be described below) through the TFTs, and liquid crystal molecules between the pixel electrode and the common electrode are aligned according to the signal voltage to determine light transmittance.

Meanwhile, although not shown, the color filter array substrate 110a includes red, green, blue or blue-green, magenta, and yellow color filters repeatedly formed and demarcated by black matrices and a common electrode (not shown).

Polarizers (not shown) converting polarization characteristics of a light beam provided from the lower backlight unit 150 are disposed above and below two sheets of substrates of the liquid crystal panel 110. The polarizers (not shown) attached to upper and lower sides of the liquid crystal panel 110 serve to enable light incident while vibrating in various directions to become light vibrating only in one direction (namely, polarization).

The backlight unit 150 is a light source for a display because the liquid crystal panel 100 is not self-luminous. The backlight unit 150 is positioned in a lower portion of the liquid crystal panel 110 to irradiate light to the liquid crystal panel 110. The backlight unit 150 includes a light source unit 135 generating light, a light guide plate 130 providing light generated by the light source unit 135 to the front of the liquid crystal panel 110 through a light entrance side surface 130a, a reflecting sheet 137 attached to the rear of the light guide plate 130 to reflect light emitted backwardly to enhance light efficiency, and a plurality of optical sheets 120 stacked on the front surface of the light guide plate 130 to scatter light emitted from the light guide plate 130.

As the light source unit 135, any one among a light emitting diode (LED), a cold cathode fluorescent lamp (CCFL), and an external electrode fluorescent lamp (EEFL) may be used, and here, a case in which an LED is applied as the light source unit 135 is taken as an example. The light source unit 135 includes an LED light source 131 and a board 133 on which the LED light source 131 is mounted.

The optical sheets 120 serve to diffuse and collect light output from a light exit side surface 130b of the light guide plate 130. The optical sheets 120 include a diffusion sheet 121, a prism sheet 123, and a protective sheet 125. According to circumstances, the optical sheets 120 may include two diffusion sheets and two prism sheets. The diffusion sheet 121 includes a base plate and a coated layer having a bead shape and formed on the base plate. Here, the diffusion sheet 121 serves to diffuse light from the light source unit 135 and supplies the same to the liquid crystal panel 110, and two or three diffusion sheets 121 may also be used. The prism sheet 123 includes triangular prisms arranged on an upper surface thereof. Here, the prism sheet 123 serves to collect light diffused by the diffusion sheet 121 in a direction perpendicular to the plane of the upper liquid crystal panel 110. In general, two prism sheets are used, and microprisms formed on each of the prism sheets 123 are at a predetermined angle.

Thus, light that has passed through the prim sheet 123 mostly travels vertically, providing a uniform brightness distribution. The protective sheet 125 positioned at the uppermost portion, among the optical sheets 120, protects the scratch-vulnerable prism sheet 123.

The light guide plate 130 is positioned along one side of the LED light source 131 and disposed on the rear of the liquid crystal panel 110 to guide light generated by the LED light source 131 to the rear of the liquid crystal panel 110. The light guide plate 130 includes the light entrance side surface 130a to which light is made incident from the LED light source 131, and a light exit side surface 130b extending from the light entrance side surface 130a to face the liquid crystal panel 110. Dot patterns (not shown) may be formed on the rear of the light guide plate 130 to allow light irradiated to the light entrance side surface 130a from the LED light source 131 to travel to the light exit side surface 130b.

The reflective sheet 137 reflects a partial amount of light, which is output to a lower side of the light guide plate 130, toward the light exit side surface 130b of the light guide plate 130, increasing light efficiency, and adjusts a reflection amount of the entirety of incident light such that the entirety of the light exist side surface 130b has a uniform luminance distribution. Here, the reflective sheet 137 has regular reflection characteristics that light is output at an angle at which the light was made incident.

The guide panel 140 has a rectangular frame shape with upper and lower sides opened. The components of the liquid crystal panel 110 and the backlight unit 150 are covered when assembled together with the guide panel 140. An opening 143 with a predetermined width is formed in a lower portion of an upper surface of the guide panel 140. In a state in which the FPCB 115 of the LCM 100 is coupled, the pad portion 115a of the flat-type FPCB 115 is exposed from the opening 143 of the guide panel 140 in the lower portion of the upper surface of the guide panel 140. Although not shown, a flat plate-type lower cover (not shown) with an open upper portion or any other component may be additionally disposed below the guide panel 140.

In this manner, by coupling the liquid crystal panel 110 and the backlight unit 150 to be covered by the guide panel 140, the LCM 100 according to an example embodiment of the present invention is configured.

The set PCB 300 on which various electric elements are attached is assembled to the rear of the LCM 100. The connector 200 is interposed between the LCM 100 and the set PCB 300 in order to electrically connect the LCM 100 and the set PCB 300.

Figure 7A:
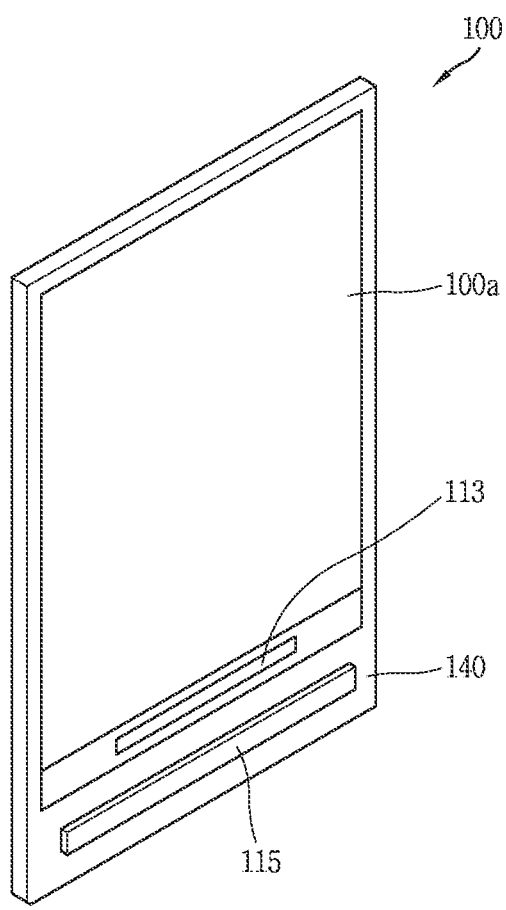
FIG. 7A is a plan view of the LCM of the LCD device according to an example embodiment of the present invention illustrating a state in which a flat-type FPCB is disposed in a lower portion of the LCM.
Figure 7B:
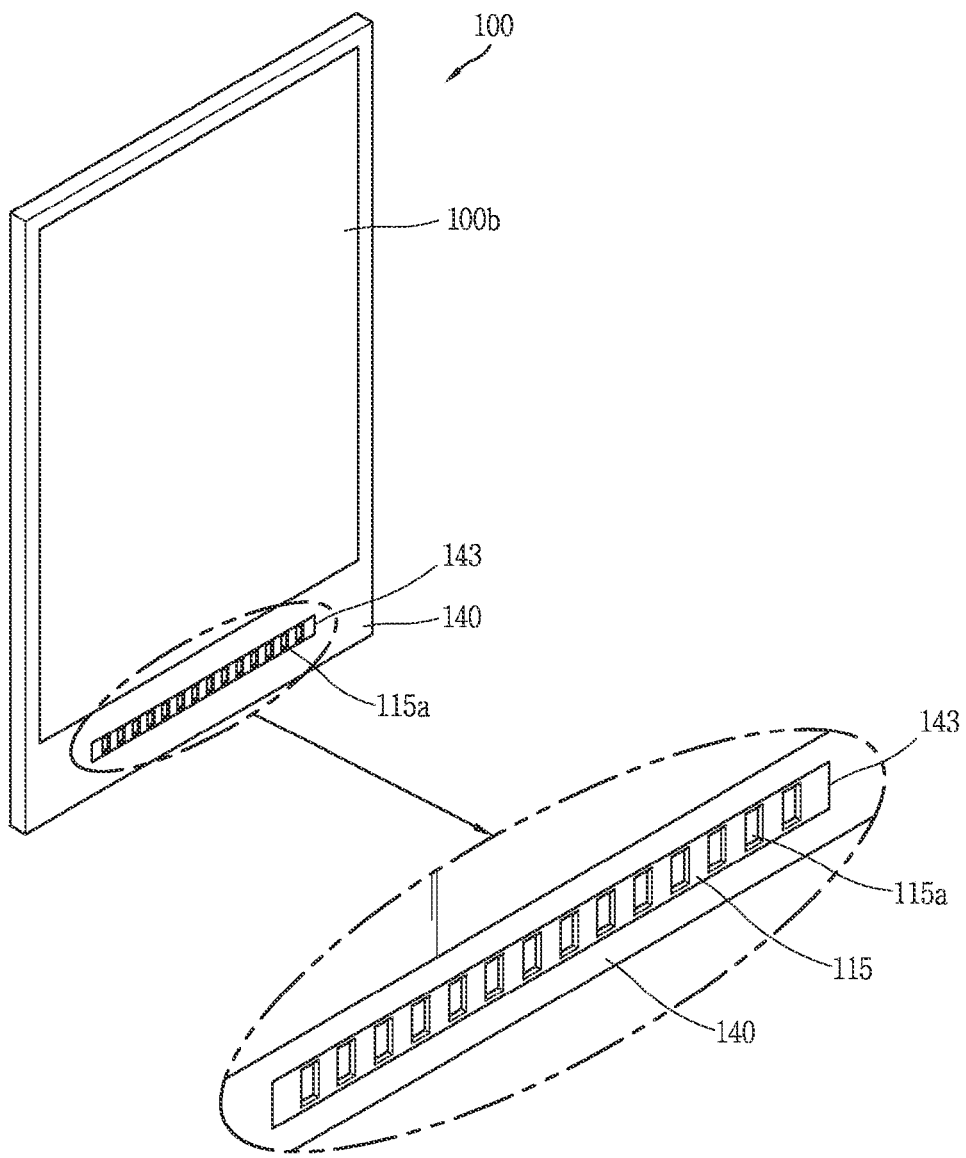
FIG. 7B is a plan view illustrating the front of the LCM of the LCD device according to an example embodiment of the present invention in which a pad portion of a flat-type FPCB is exposed from a lower portion of the LCM.

FIG. 7A is a plan view of the LCM of the LCD device according to an example embodiment of the present invention, illustrating a state in which a flat-type FPCB is disposed in a lower portion of the LCM, and FIG. 7B is a plan view illustrating the front of the LCM of the LCD device according to an example embodiment of the present invention in which a pad portion of a flat-type FPCB is exposed from a lower portion of the LCM.

With reference to FIG. 7A, the LCM 100 according to an embodiment of the present disclosure includes a liquid crystal panel (not shown) (please refer to 110 of FIG. 6), a backlight unit (not shown) (please refer to 150 of FIG. 6), and a guide panel 140 covering the liquid crystal panel and the backlight unit.

As shown in FIG. 7B, an opening 143 having a predetermined width is formed on an upper surface at a lower side of the guide panel 140 positioned on a front surface 100a of the LCM 100, and the flat-type FPCB 115 connected to the driver 113 of the liquid crystal panel 110 is disposed in the opening 143. Here, the pad portion 115a provided in a lower portion of the FPCB 115 is exposed through the opening 143 of the guide panel 140. The pad portion 115a may be formed as a plurality of protrusions or recesses. In an embodiment of the present disclosure, the pad portion 115a is formed as recesses.

Figure 8A:
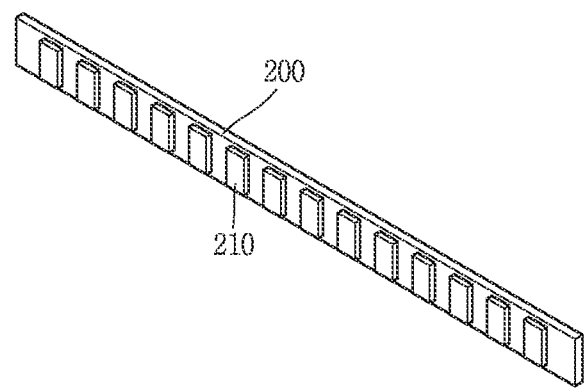
FIG. 8A is a perspective view illustrating the front of a connector fastened to a pad portion of the LCM of the LCD device according to an embodiment of the present invention.
Figure 8B:
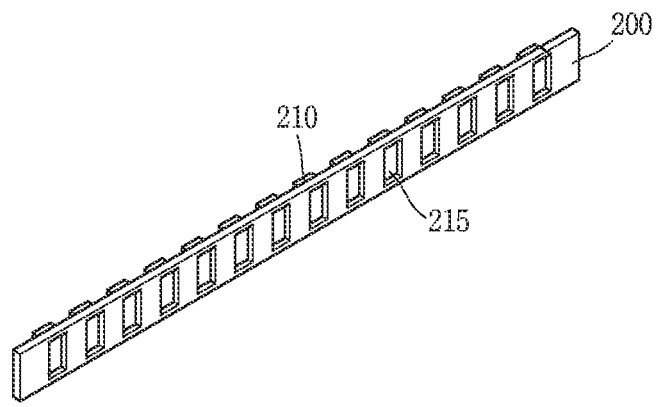
FIG. 8B is a perspective view illustrating the rear of the connector fastened to a PCB connector portion of the set PCB of the LCD device according to an example embodiment of the present invention.

FIG. 8A is a perspective view illustrating the front of a connector fastened to a pad portion of the LCM of the LCD device according to an example embodiment of the present invention, and FIG. 8B is a perspective view illustrating the rear of the connector fastened to a PCB connector portion of the set PCB of the LCD device according to an example embodiment of the present invention.

With respect to FIGS. 8A and 8B, the connector 200 serves to electrically connect the flat-type FPCB 115 of the LCM 100 and the set PCB 300.

A plurality of first terminals 210 to be electrically fastened to the pad portion 115a of the FPCB 115 are provided on the front of the connector 200, and second terminals 215 to which the PCB connection portion (not shown) (please refer to 310 of FIG. 9A) of the set PCB (not shown) (please refer to 300 of FIG. 9A) coupled to the LCM 100 is insertedly fastened are provided on the rear of the connector 200. Here, at least one of the first terminals 210 and the second terminals 215 may be formed as a plurality of protrusions or recesses. In this embodiment, the first terminals 210 may be protrusions and the second terminals 215 may be recesses. The shapes of the first terminals 210 and the second terminals 215 of the connector 200 may be changed according to shapes of the pad portion 115a of the FPCB 115 and third terminals 315 of the set PCB 300.

Figure 9A:
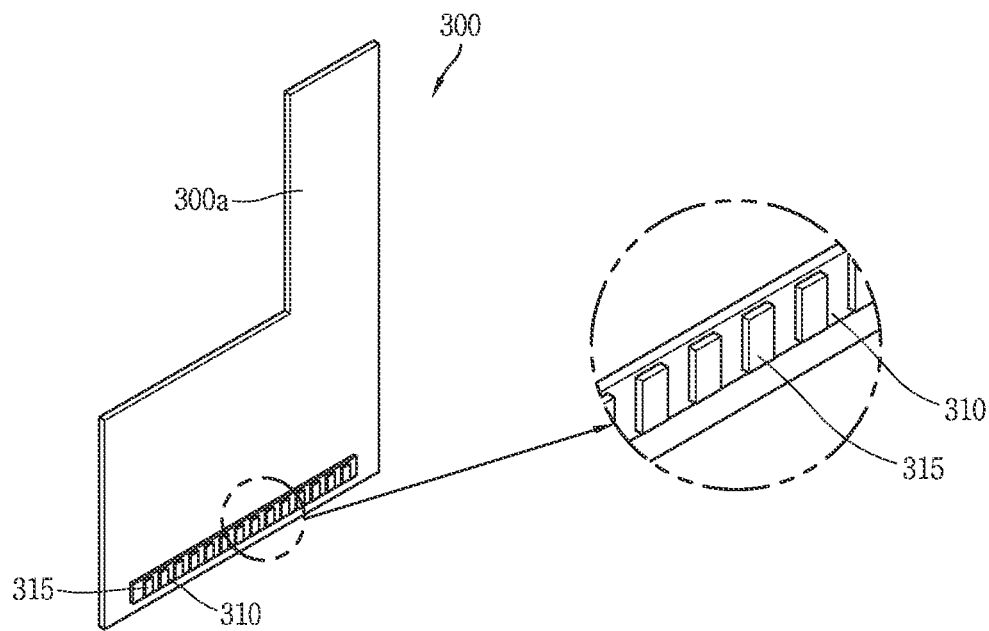
FIG. 9A is a perspective view illustrating the set PCB of the LCD device according to an example embodiment of the present invention in which protrusions are disposed in a lower portion of the front of the set PCB and fastened to the pad portion of the FPCB.
Figure 9B:
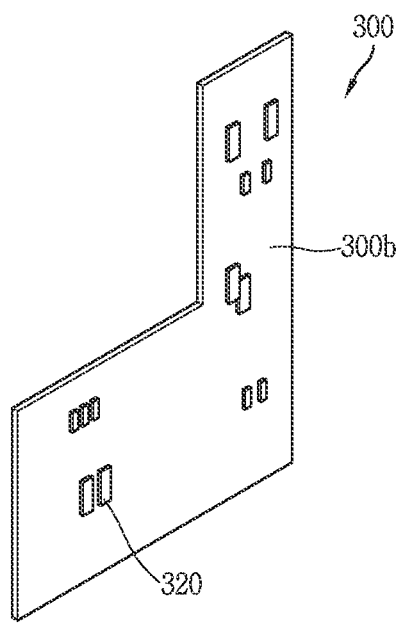
FIG. 9B is a perspective view illustrating the rear of the set PCB of the LCD device according to an example embodiment of the present invention in which various electronic elements are provided.

FIG. 9A is a perspective view illustrating the set PCB of the LCD device according to an example embodiment of the present disclosure, in which protrusions are disposed in a lower portion of the front of the set PCB and fastened to the pad portion of the FPCB, and FIG. 9B is a perspective view illustrating the rear of the set PCB of the LCD device according to an example embodiment of the present invention in which various electronic elements are provided.

As illustrated in FIGS. 9A and 9B, a PCB connector portion 310 to which various electric elements 320 are electrically connected is provided in a lower portion of the set PCB 300 coupled to the rear of the LCM 100, and third terminals 315 fastened to the second terminals 215 of the connector 200 are provided in the PCB connector portion 310. Here, the electric elements 320 are provided on the rear of the set PCB 300. The third terminals 315 may be formed as a plurality of protrusions or recesses. In the present embodiment, the third terminals 315 are protrusions.

An assembly method of an LCD device according to an example embodiment of the present invention will be described with reference to FIGS. 10 and 11.

Figure 10:
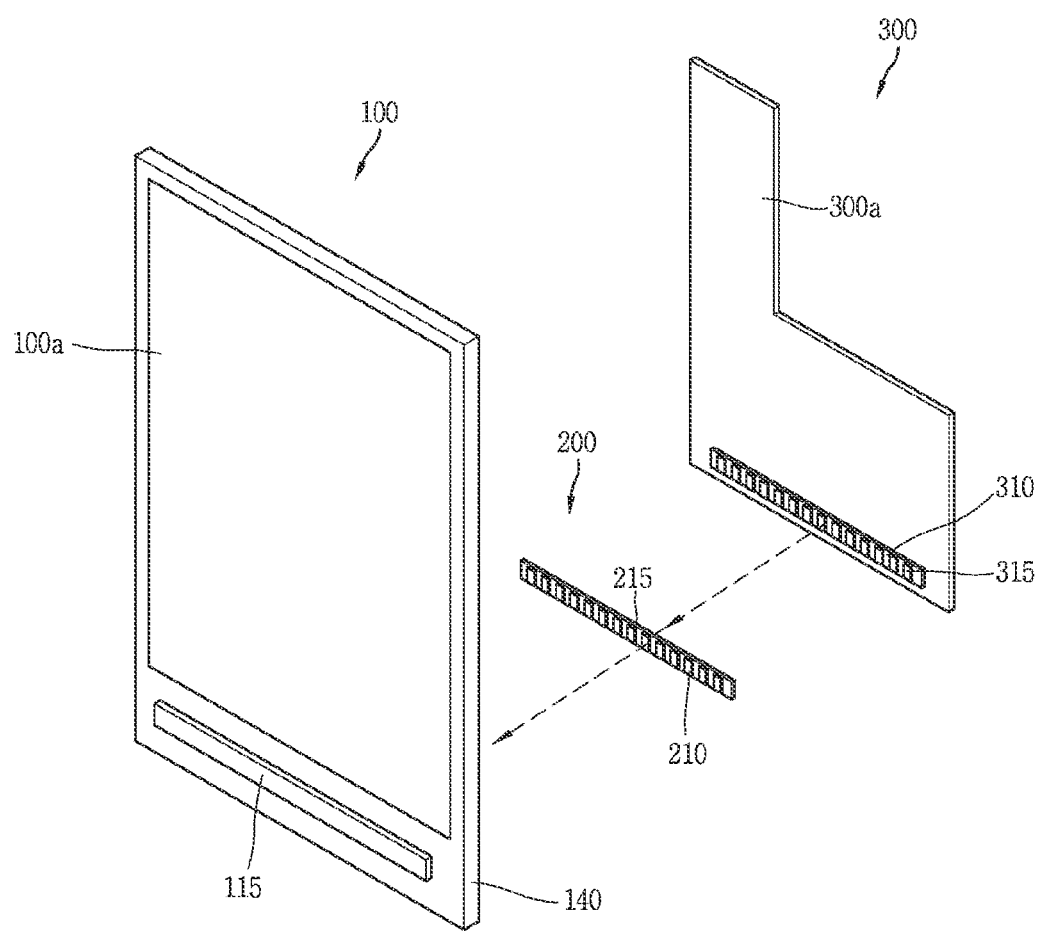
FIG. 10 is an exploded perspective view illustrating the front of the LCM, the front of the set PCB, and the front of a connector disposed between the LCM and the set PCB to fasten a pad portion and a PCB connector portion in the LCD device according to an example embodiment of the present invention.

FIG. 10 is an exploded perspective view illustrating the front of the LCM, the front of the set PCB, and the front of a connector disposed between the LCM and the set PCB to fasten a pad portion and a PCB connector portion, in the LCD device according to an example embodiment of the present invention. FIG. 11 is an exploded perspective view illustrating the rear of the LCM, the rear of the set PCB, and the rear of a connector disposed between the LCM and the set PCB to fasten the pad portion and the PCB connector portion, in the LCD device according to an example embodiment of the present invention.

Figure 11:
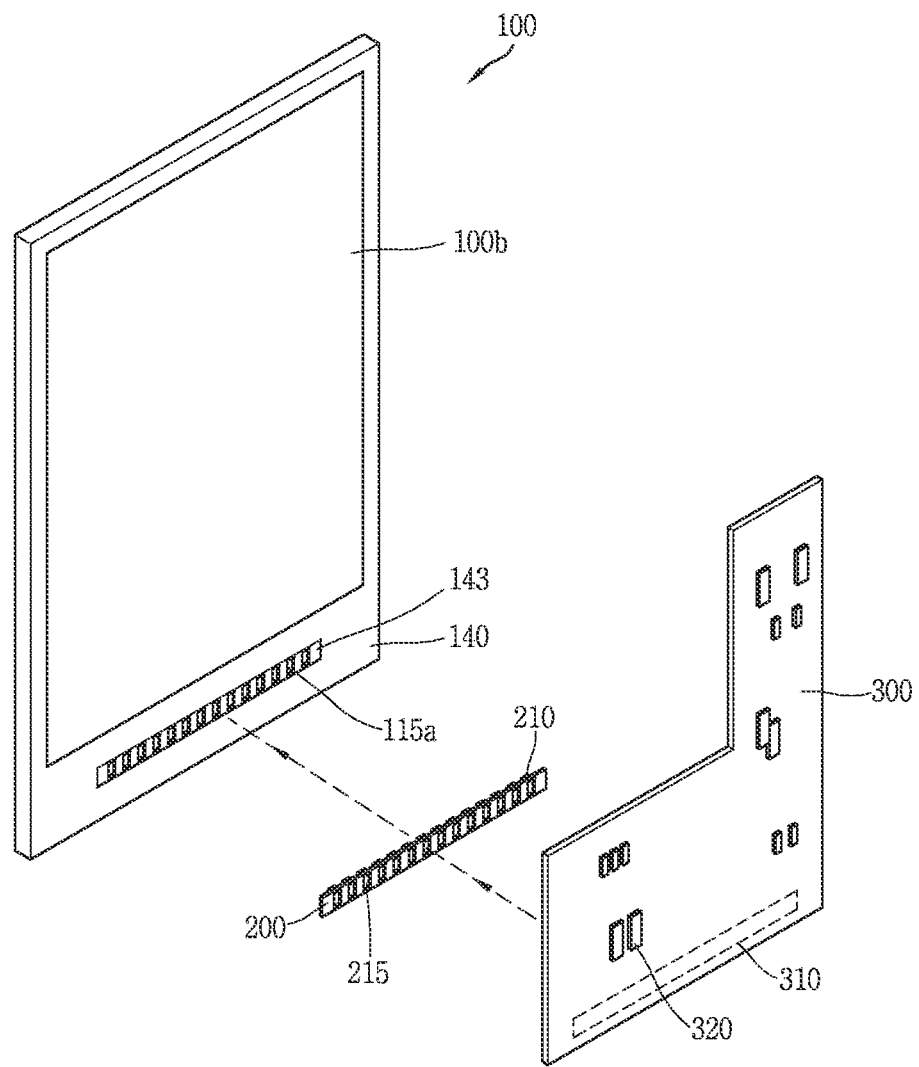
FIG. 11 is an exploded perspective view illustrating the rear of the LCM, the rear of the set PCB, and the rear of a connector disposed between the LCM and the set PCB to fasten the pad portion and the PCB connector portion, in the LCD device according to an example embodiment of the present invention.

In FIGS. 10 and 11, the LCM 100 includes a liquid crystal panel (please refer to 110 of FIG. 6), a backlight unit (please refer to 150 of FIG. 6), and the guide panel 140 covering the liquid crystal panel and the backlight unit is prepared.

Next, the flat-type FPCB 115 connected to the driver 113 of the liquid crystal panel 110 is disposed on and attached to an upper surface of the lower portion of the guide pane 140 positioned on the front 100a of the LCM 100, and the pad portion 115a of the FPCB 115 is exposed through the opening 143 of the guide panel 140.

Subsequently, the connector 200 including a plurality of first terminals 210 provided on one surface thereof and a plurality of second terminals 215 provided on the other surface thereof is prepared.

Thereafter, the connector 200 is inserted into the opening 143 formed in the guide panel 140 such that the first terminals 210 of the guide panel 140 are inserted to be fastened to the pad portion 115a of the FPCB 115.

Thereafter, the set PCB 300 including the PCB connector portion 310 having a plurality of third terminals 315 provided in a rear portion of a front surface thereof and various electric elements 320 provided on a rear surface thereof is prepared.

Thereafter, the set PCB 300 is positioned on the rear 100b of the LCM 100, and the third terminals 315 provided in the PCB connector portion 310 of the set PCB 300 are inserted into the second terminals 215 of the connector 200 to couple the LCM 100 and the set PCB 300, thus completing the assembly process of the LCD device according to an example embodiment of the present invention.

In this manner, rather than adopting the assembly method in which a flat-type FPCB of an LCM is bent and attached to the rear of a frame through circuit insertion holes formed in a middle frame, and thereafter, a pad portion of the FPCB is fastened to an PCB connector portion of a set PCB coupled thereafter, such as that of the related art, in the LCD device according to example embodiments of the present disclosure, the pad portion of the FPCB and the PCB connector portion of the set PCB are fastened using the separate connector, whereby a defect and a degradation of quality due to bending of the FPCB when a product is assembled can be prevented.

Also, in the LCD device according to example embodiments of the present invention, because the FPCB of the LCM and the set PCB are directly fastened using the separate connector, a thickness of the LCD device can be reduced and a slim depth can be implemented, compared to the case of bending the FPCB as in the related art.

In addition, in the LCD device according to example embodiments of the present invention, because the FPCB of the LCM and the set PCB are directly fastened and assembled using the separate connector, a middle frame is omitted, implementing a slim depth.

Furthermore, eliminating the operations of bending the FPCB, coupling the LCM and the set PCB, and subsequently fastening the pad portion of the FPCB and the PCB connector portion of the set PCB as in the related art, in the LCD device according to example embodiments of the present invention, the pad portion of the flat-type FPCB and the PCB connector portion of the set PCB are easily fastened using the separate connector. Thus, an assembly process time of the LCD device can be significantly reduced.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

It will be apparent to those skilled in the art that various modifications and variations can be made in the liquid crystal display of the present invention without departing from the spirit or scope of the invention. Thus, it is intended that the present invention cover the modifications and variations of this invention provided they come within the scope of the appended claims and their equivalents.

What is claimed is:

1. A liquid crystal display (LCD), comprising:
   a liquid crystal module defining an opening, the liquid crystal module including a printed circuit board having a pad portion exposed to the opening;
   a set printed circuit board disposed adjacent a surface of the liquid crystal module; and
   a connector disposed between the pad portion of the printed circuit board and the set printed circuit board through the opening, the connector having a plurality of terminals,
   wherein the printed circuit board and the set printed circuit board are electrically connected to the connector.

2. The liquid crystal display according to claim 1, wherein the liquid crystal module includes a liquid crystal panel to display an image, a backlight unit to provide light to the liquid crystal panel, and a guide panel to couple the liquid crystal panel and the backlight.

3. The liquid crystal display according to claim 2, wherein the opening is defined in the guide panel, and wherein the connector is disposed to connect the liquid crystal panel with the set printed circuit board through the opening.

4. The liquid crystal display according to claim 2, wherein the guide panel has a rectangular frame shape and covers electrical components of the liquid crystal panel.

5. The liquid crystal display according to claim 1, wherein the printed circuit board is a flexible flat-type printed circuit board disposed to cover the opening with the pad portion adjacent to the opening to connect with the connector.

6. The liquid crystal display according to claim 1, wherein the plurality of terminals of the connector includes a plurality of first terminals to be electrically fastened to the liquid crystal module and a plurality of second terminals to be electrically fastened to the set printed circuit board, and wherein the plurality of first terminals including one of protrusions and recesses and the plurality of second terminals including the other of protrusions and recesses.

7. The liquid crystal display according to claim 2, wherein the backlight unit includes:
   a light source configured to generate light;
   a light guide plate configured to provide light from the light source to the liquid crystal panel;
   a reflecting sheet attached to aside of the light guide plate away from the liquid crystal panel; and
   an optical sheet between the light guide plate and the liquid crystal panel to diffuse light provided from the light guide plate.

8. A liquid crystal display (LCD), comprising:
   a liquid crystal module defining an opening, the liquid crystal module including a printed circuit board having a pad portion exposed to the opening;
   a set printed circuit board disposed adjacent a surface of the liquid crystal module; and
   a connector disposed between the liquid crystal module and the set printed circuit board through the opening to electrically connect the liquid crystal module and the pad portion,
   wherein the connector includes a plurality of terminals, and is fastened to the liquid crystal module and the set printed circuit board.

9. The liquid crystal display according to claim 8, wherein the liquid crystal module includes a liquid crystal panel to display an image, a backlight to provide light to the liquid crystal panel, and a guide panel to couple the liquid crystal panel and the backlight.

10. The liquid crystal display according to claim 9, wherein the opening is defined in the guide panel, and wherein the connector is disposed to connect the liquid crystal panel with the set printed circuit board through the opening.

11. The liquid crystal display according to claim 10, wherein the guide panel has a rectangular frame shape and covers electrical components of the liquid crystal panel.

12. The liquid crystal display according to claim 8, wherein the printed circuit board is a flexible flat-type printed circuit board disposed to cover the opening with the pad portion adjacent to the opening to connect with the connector.

13. The liquid crystal display according to claim 9, wherein the backlight includes:
a light source configured to generate light;
a light guide plate configured to provide light from the light source to the liquid crystal module;
a reflecting sheet attached to a side of the light guide plate away from the liquid crystal module; and
an optical sheet between the light guide plate and the liquid crystal module to diffuse light provided from the light guide plate.

14. The liquid crystal display according to claim 8, wherein the plurality of terminals of the connector includes a plurality of first terminals to be fastened to the liquid crystal module and a plurality of second terminals to be fastened to the set printed circuit board, and wherein the plurality of first terminals including one of protrusions and recesses and the plurality of second terminals including the other of protrusions and recesses.

15. A liquid crystal display (LCD), comprising:
a liquid crystal panel configured to display an image;
a backlight unit configured to provide light to the liquid crystal panel;
a guide panel configured to couple the liquid crystal panel and the backlight unit, the guide panel defining an opening therethrough;
a printed circuit board connected to the liquid crystal panel and having a pad portion, the pad portion being extended beyond an edge of the liquid crystal panel and positioned adjacent to the opening of the guide panel;
a set printed circuit board having a PCB connector positioned adjacent to the opening of the guide panel; and
a connector disposed through the opening to electrically connect the PCB connector of the set printed circuit board and the pad portion of the printed circuit board.

16. The liquid crystal display according to claim 15, wherein the guide panel has a rectangular frame shape and covers electrical components of the liquid crystal panel.

17. The liquid crystal display according to claim 15, wherein the printed circuit board is a flexible flat-type printed circuit board disposed to cover the opening with the pad portion adjacent to the opening to connect with the connector.

18. The liquid crystal display according to claim 15, wherein the connector includes a plurality of first terminals to be electrically fastened to the liquid crystal panel and a plurality of second terminals to be electrically fastened to the set printed circuit board, and wherein the plurality of first terminals including one of protrusions and recesses and the plurality of second terminals including the other of protrusions and recesses.

19. The liquid crystal display according to claim 15, wherein the backlight unit includes:
a light source configured to generate light;
a light guide plate configured to provide light from the light source to the liquid crystal panel;
a reflecting sheet attached to a side of the light guide plate away from the liquid crystal panel; and
an optical sheet between the light guide plate and the liquid crystal panel to diffuse light provided from the light guide plate.

20. A liquid crystal display (LCD), comprising:
a liquid crystal module defining an opening, the liquid crystal module including a printed circuit board having a pad portion exposed to the opening;
a set printed circuit board disposed adjacent a surface of the liquid crystal module; and
a connector disposed between the liquid crystal module and the set printed circuit board through the opening to electrically connect the liquid crystal module and the pad portion,
wherein the connector includes a plurality of first terminals to be electrically fastened to the liquid crystal module and a plurality of second terminals to be electrically fastened to the set printed circuit board, and wherein the plurality of first terminals including one of protrusions and recesses and the plurality of second terminals including the other of protrusions and recesses.

\* \* \* \* \*